US 12,388,684 B2

(12) United States Patent
Levin et al.

(10) Patent No.: US 12,388,684 B2
(45) Date of Patent: Aug. 12, 2025

(54) SERDES CIRCUIT CTLE ADAPTATION USING ISI METERING

(71) Applicant: Intel Corporation, Santa Clara, CA (US)

(72) Inventors: Itamar Levin, Holon (IL); Tali Warshavsky, Ramat Gan (IL); Yekutiel Uliel, Jerusalem (IL)

(73) Assignee: Intel Corporation, Santa Clara, CA (US)

(*) Notice: Subject to any disclaimer, the term of this patent is extended or adjusted under 35 U.S.C. 154(b) by 811 days.

(21) Appl. No.: 17/484,105

(22) Filed: Sep. 24, 2021

(65) Prior Publication Data

US 2023/0099103 A1    Mar. 30, 2023

(51) Int. Cl.
*H04L 25/03* (2006.01)
*H04L 27/01* (2006.01)

(52) U.S. Cl.
CPC ........ *H04L 25/03006* (2013.01); *H04L 27/01* (2013.01)

(58) Field of Classification Search
CPC ............. H04L 25/03006; H04L 27/01; H04L 25/03885; H04L 5/0053; H03M 1/183
USPC .......................... 375/316, 229, 232–233, 327
See application file for complete search history.

(56) References Cited

U.S. PATENT DOCUMENTS

| 8,848,774 | B2* | 9/2014 | Zhong | H04L 25/03343 |
| | | | | 375/232 |
| 9,106,462 | B1* | 8/2015 | Aziz | H04L 25/03057 |
| 9,838,072 | B1* | 12/2017 | Dai | H04L 25/03885 |
| 10,791,009 | B1* | 9/2020 | Wu | H04L 7/0058 |
| 11,133,963 | B1* | 9/2021 | Zheng | H04B 1/123 |
| 2014/0064351 | A1* | 3/2014 | Hidaka | H04L 27/01 |
| | | | | 375/232 |
| 2014/0225669 | A1* | 8/2014 | Zhong | H03F 3/45197 |
| | | | | 330/254 |
| 2016/0352557 | A1* | 12/2016 | Liao | H04L 25/03885 |
| 2017/0170992 | A1* | 6/2017 | Hidaka | H04L 25/03006 |
| 2017/0310510 | A1* | 10/2017 | Hidaka | H04L 25/03057 |
| 2022/0286327 | A1* | 9/2022 | Manian | H04L 25/03057 |

* cited by examiner

*Primary Examiner* — Emmanuel Bayard
(74) *Attorney, Agent, or Firm* — Schwegman Lundberg & Woessner, P.A.

(57) ABSTRACT

A CTLE-based SERDES receiver circuit using ISI metering provides an improved SERDES I/O performance. The CTLE SERDES receiver circuit may include an analog receiver frontend to generate an analog-to-digital converter (ADC) digital signal and a reduced ISI signal, a data path circuit to generate a sliced data stream and sliced cursor error stream, a digital signal processing (DSP) circuit to generate a converged data stream, a multi-tap intersymbol interference (ISI) assessment circuit to generate a weighted ISI sum, and an ISI minimization circuit to generate a continuous time linear equalizer (CTLE) adaptation control signal based on the weighted ISI sum.

22 Claims, 6 Drawing Sheets

SERDES CIRCUIT CTLE ADAPTATION USING ISI METERING

TECHNICAL FIELD

Embodiments described herein pertain to integrated circuit (IC) devices and systems. Some embodiments relate to Serializer/Deserializer (SERDES) designs for IC devices and systems.

BACKGROUND

SERDES circuits are used in IC devices and systems to convert data bidirectionally between a parallel interface and a serial interface. SERDES circuits are often used in high-speed input/output (I/O) communications. Various types of equalizers may be used in SERDES circuits to provide channel equalization by reducing mean squared error (MSE) due to intersymbol interference (ISI). However, these equalizers require considerable convergence time, suffer from convergence monotonicity and divergence issues, and are sensitive to voltage drifts and temperature drifts.

DETAILED DESCRIPTION

A SERDES circuit that includes a CTLE using multi-tap ISI metering provides improved SERDES I/O performance. These SERDES circuits use a continuous-time linear equalizer (CLTE) circuit (e.g., peaking filter circuit) to equalize an input signal by applying a linear peaking filter, prior to amplifying and sampling the signal. These CLTE SERDES circuits are tuned by examining a weighted sum of multiple ISI components based on a robust and computationally efficient method for setting ISI component weights and calculating a weighted sum. These tuning algorithms are robust and applicable to various CTLE architectures and frequency domain responses. The ability to identify different weights to different ISI components provides improved flexibility in shaping the pulse response of the receiver architecture, giving more importance to specific ISI components through higher weight. This improves various performance metrics, such as signal-to-noise (SNR) optimization, crosstalk response, robustness against reflections, and other performance metrics. These SERDES circuits provide improvements to the receiver side of the SERDES (e.g., the De-Serializer), and "SERDES circuits" is used herein to refer to the SERDES receiver.

The SERDES CLTE circuits described herein provide various advantages. In contrast with scanning CTLE coefficients that requires a fully converged receiver, these CLTE circuits provide the ability to tune CTLE coefficients during convergence, which improves performance for various protocols and improves power saving mode performance. In contrast with CTLE convergence based only on one post-cursor tap or eye diagram parameters assessment, these CLTE circuits provide the ability to incorporate pulse rise time, CTLE architecture, ISI components, circuit nonlinearities, noise levels, and other considerations to improve CTLE convergence. Additional improvements and benefits are described below with reference to FIG. 1 through FIG. 6.

Figure 1:
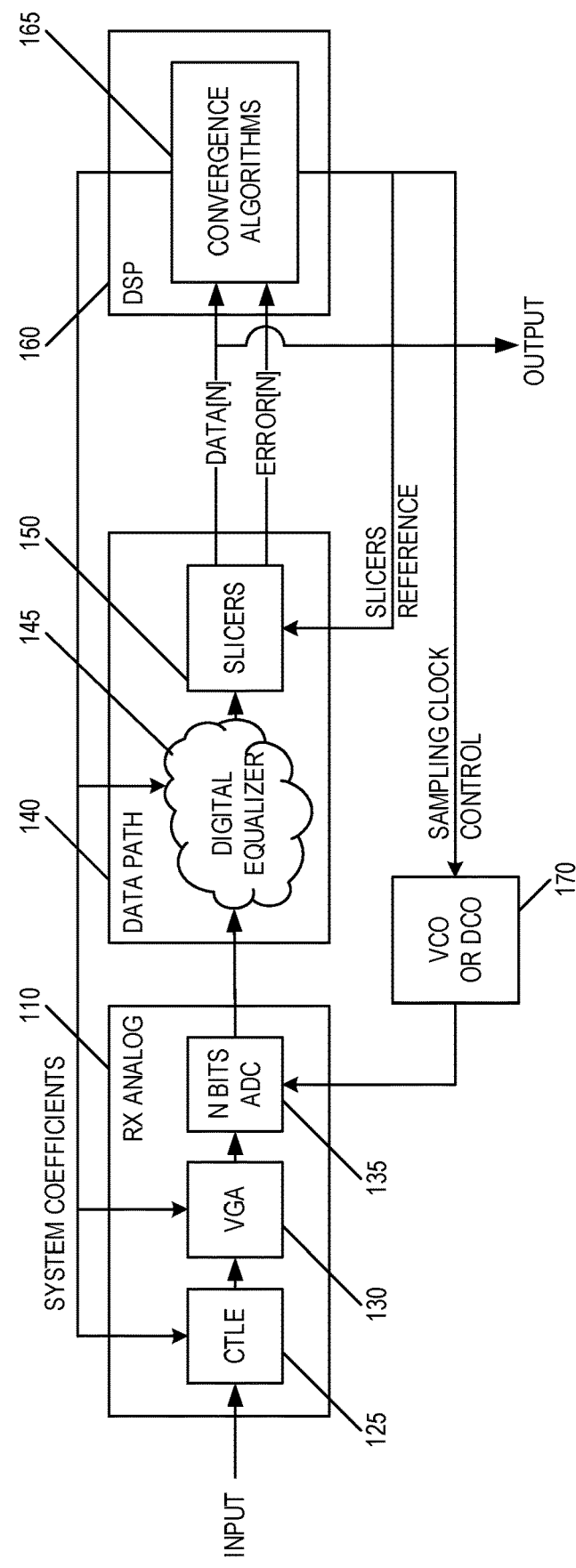
FIG. 1 shows a high-level architecture of a SERDES circuit, according to some embodiments described herein.

FIG. 1 shows a high-level architecture of a SERDES circuit 100, according to some embodiments described herein. SERDES circuit 100 receives an analog input signal at a CTLE circuit 125 within analog receiver frontend circuit group 110. The CTLE circuit 125 may function as the first equalization stage in the receiver. The CTLE circuit 125 may include one or more stages of CTLE to provide additional peaking filter range. The CTLE stages may include one or more CTLE architectures, such as CTLE architectures shown in FIG. 2. The frequency response of CTLE circuit 125 may be selected to attenuate or amplify various frequency regions within the input signal, such as CTLE frequency responses and CTLE parameter sweeps shown in FIG. 3. The CTLE circuit 125 generates a CTLE signal based on the received analog input signal. The CTLE signal is further amplified within a variable gain amplifier (VGA) circuit 130 to generate a VGA signal, and an analog-to-digital conversion (ADC) circuit 135 samples the VGA signal to produce an ADC digital signal.

The ADC digital signal is provided from the analog receiver frontend circuit group 110 to a digitally controlled equalizer circuit 145 within the data path circuit group 140. The digitally controlled equalizer circuit 145 may include one or more of a feed-forward equalizer (FFE) and a decision feedback equalizer (DFE). The digitally controlled equalizer circuit 145 generates a digitally equalized signal by equalizing the ADC digital signal to reduce the remaining ISI. The digitally equalized signal is then fed to slicers 150 to generate a sliced data stream (e.g., data symbols or decisions) and a cursor error stream (e.g., sliced error stream, unsliced error stream) based on whether bits within the digitally equalized signal are above or below a detected digital symbol.

The sliced data stream and a cursor error stream are then provided to convergence algorithms 165 within a digital signal processing (DSP) circuit group 160 to generate a converged data stream output. The convergence algorithms 165 also provides feedback signals to tune and otherwise improve the performance of SERDES circuit 100, such as providing system coefficients to the CTLE circuit 125, the VGA circuit 130, and the digitally controlled equalizer circuit 145. The convergence algorithms 165 may also provide a slicers reference signal to slicers 150, and may provide a sampling clock control signal to a voltage-controlled oscillator (VCO) or digitally controlled oscillator (DCO) circuit 170 whose output frequency and signal edges are used by the ADC circuit 135 to time the sampling of the VGA output signal. While the CLTE SERDES circuits are described herein with respect to ADC-based receivers, they may also be used to improve ISI performance of analog receivers that do not include an ADC.

Figure 2A:
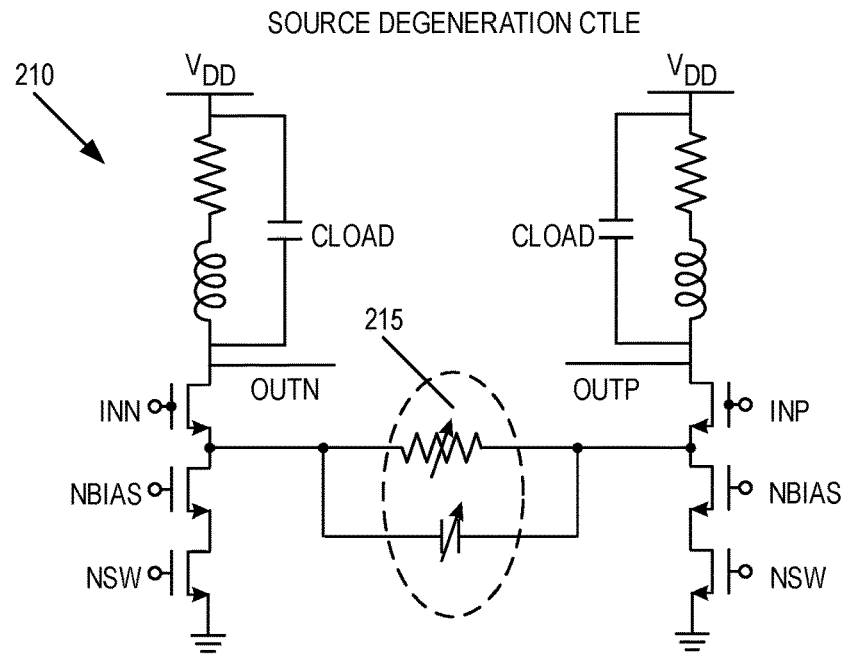
FIGS. 2A-2B shows CTLE circuit architectures, according to some embodiments described herein.
Figure 2B:
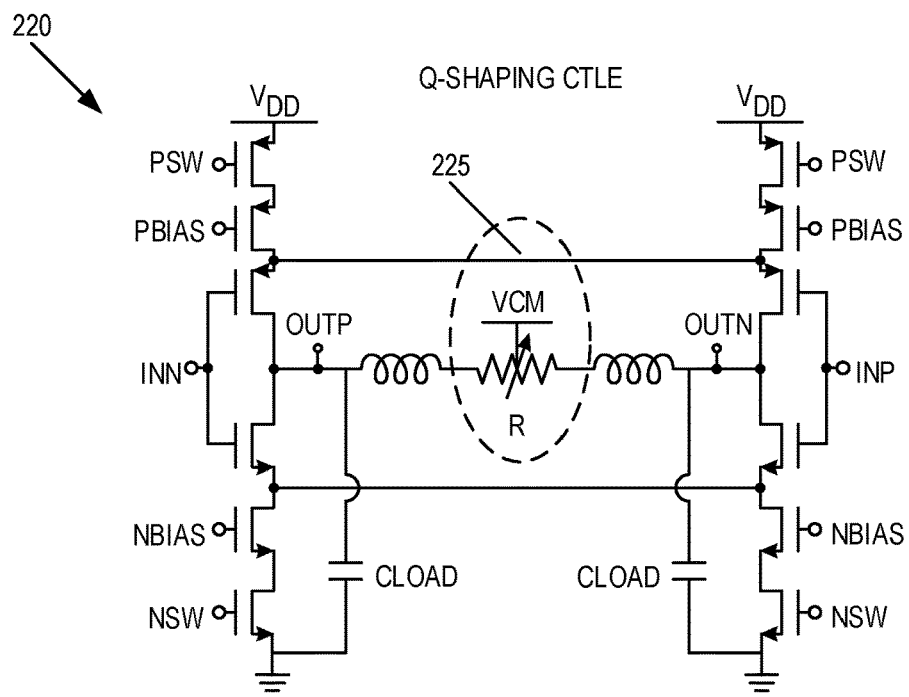

FIGS. 2A-2B shows CTLE circuit architectures 200, according to some embodiments described herein. FIG. 2A shows a first example CTLE circuit that includes a source degeneration CTLE circuit 210. The source degeneration CTLE circuit 210 includes a parallel variable resistor and variable capacitor circuit 215. Because the variable capacitor has a lower impedance at higher frequencies (e.g., at least 1 GHz), the variable capacitor circuit 215 may provide improved high-frequency performance. FIG. 2B shows a second example CTLE circuit that includes a q-shaping CTLE circuit 220. The q-shaping CTLE circuit 220 includes a variable resistor circuit 225. A quality factor is determined by controlling resistance value within variable resistor circuit 225, where an increased quality factor may reduce direct current (DC) gain while increasing gain at a CTLE resonance frequency. While example CTLE circuit architectures 200 are described with respect to source degeneration CTLE circuit 210 and q-shaping CTLE circuit 220, other CTLE architectures may be used and tuned or optimized by the invention.

Figure 3A:
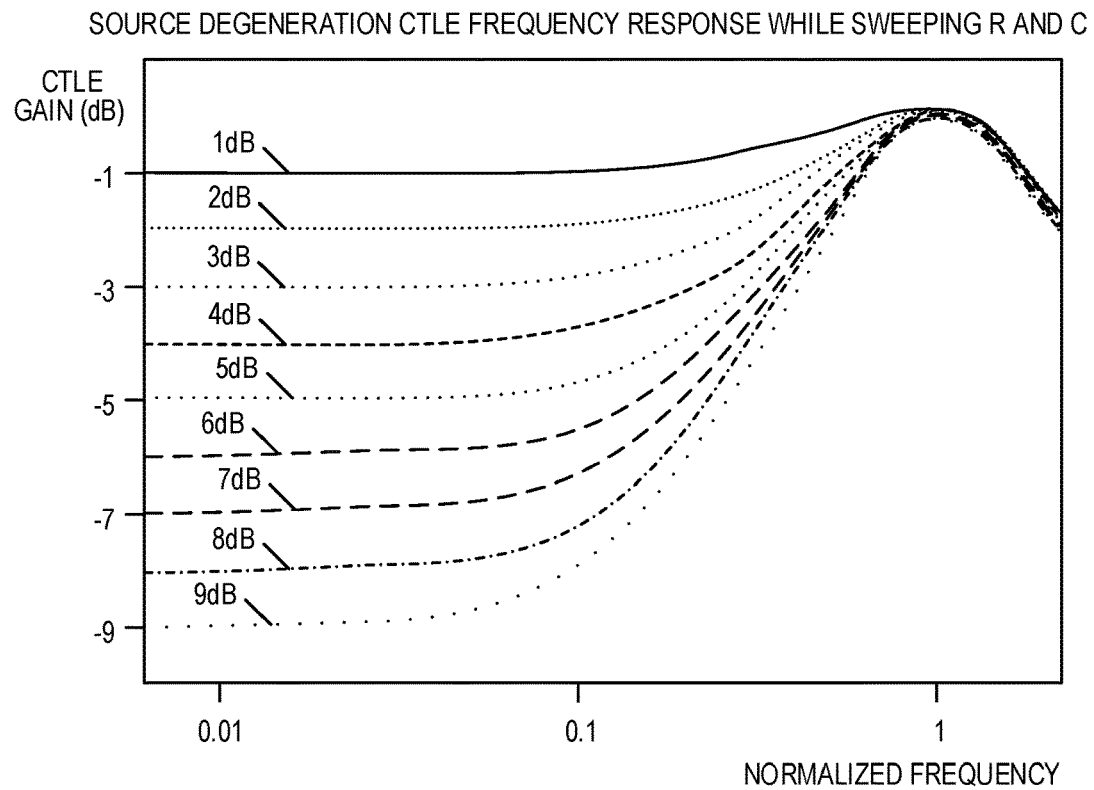
FIGS. 3A-3B shows CTLE frequency response graphs, according to some embodiments described herein.
Figure 3B:
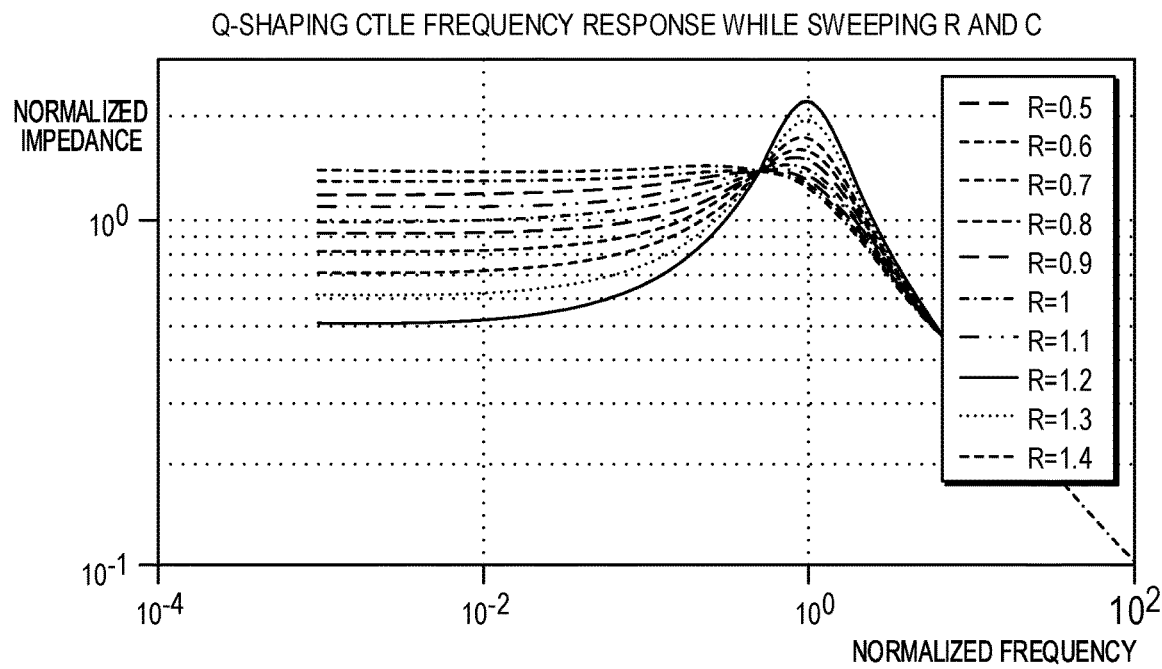

FIGS. 3A-3B shows CTLE frequency response graphs 300, according to some embodiments described herein. FIG. 3A shows CTLE frequency response (e.g., CTLE gain) while tuning a source degeneration CTLE circuit by sweeping resistance (R) and capacitance (C) values for the source degeneration CTLE circuit. FIG. 3B shows CTLE frequency response while sweeping R and C values for a q-shaping CTLE circuit. CTLE frequency response graphs 300 show that the frequency response of a CTLE circuit may be selected to attenuate or amplify various frequency regions within an input signal. As can be deduced in CTLE frequency response graphs 300, the tuning of a CTLE circuit may affect precursor signal impulses (e.g., signal impulses before the main cursor signal impulse of interest) and may affect postcursor signal impulses (e.g., signal impulses after the main cursor signal impulse of interest). The tuning of a CTLE circuit may affect near-cursor and far-from-cursor ISI components as a function of its zero frequency location and overall CTLE frequency response shape. Additionally, influencing frequency response near the Nyquist frequency of the system affects ISI close to the cursor, while influencing the frequency response at lower frequencies affects the ISI components further away from the cursor and the general shape of the equalized overall system pulse response. Because each CTLE circuit functions as a continuous filter, a change in the CTLE peaking filter will affect the entire ISI map. The CLTE SERDES circuits described herein reduce or minimize the residual ISI of the system, such as described below with respect to SERDES circuit 400 shown in FIG. 4.

Figure 4:
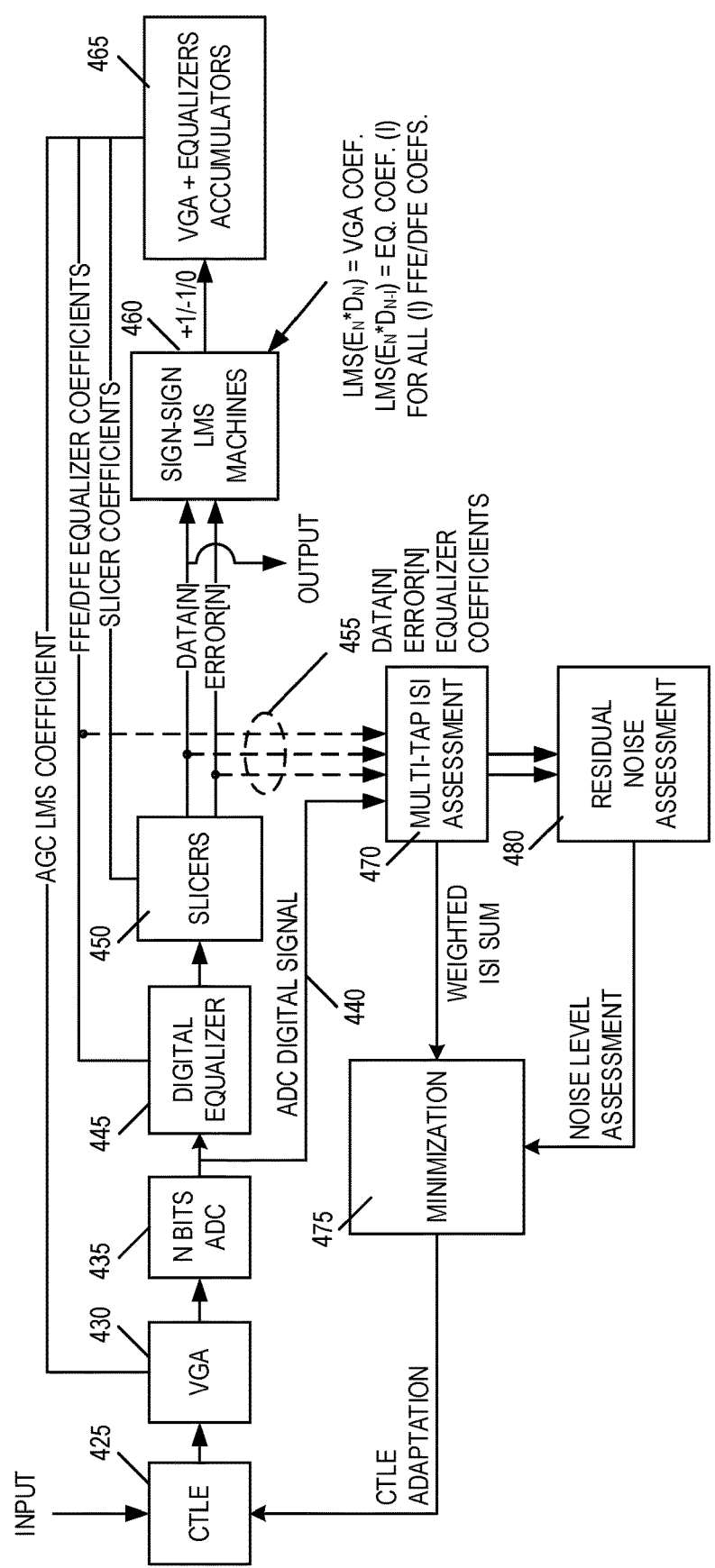
FIG. 4 shows an architecture of a SERDES circuit, according to some embodiments described herein.

FIG. 4 shows an architecture of a SERDES circuit 400, according to some embodiments described herein. SERDES circuit 400 receives an analog input signal at a CTLE circuit 425. The CTLE circuit 425 generates a CTLE signal based on the received analog input signal. The CTLE signal is amplified within a VGA circuit 430 to generate a VGA signal, and an ADC circuit 435 samples the VGA signal to produce an ADC digital signal. A VCO/DCO may also be used, such as the VCO/DCO 170 shown in FIG. 1. The ADC digital signal is provided to the digital equalizer circuit 445, which generates a digitally equalized signal by equalizing the ADC digital signal to reduce the remaining ISI. The digitally equalized signal is then fed to slicers 450 to generate a sliced data stream and a cursor error stream (e.g., sliced error stream or unsliced error stream). The slicers output DATA[N] is the data stream output of the SERDES receiver.

The sliced data stream and a cursor error stream are provided from the slicers 450 to a sign-sign least means squared (LMS) circuit 460. The sign-sign LMS circuit 460 generates equalizer coefficient commands (e.g., equalizer up (+1) command, equalizer down (−1) command, equalizer stay (0) command) based on the sliced data stream and the cursor error stream. The sign-sign LMS circuit 460 also generates VGA coefficient commands (e.g., VGA up (+1) command, VGA down (−1) command, VGA stay (0) command) based on the sliced data stream and the cursor error stream.

The equalizer coefficient commands (e.g., up/down/stay command) are used by the coefficient accumulator circuit 465 to generate equalizer coefficients that are used by the digital equalizer circuit 445. Similarly, the VGA coefficient commands are used by the coefficient accumulator circuit 465 to generate automatic gain control (AGC) LMS coefficients that are used by the VGA circuit 430. The coefficient accumulator circuit 465 may also provide slicer level coefficients to slicers 450.

The SERDES circuit 400 may be used to reduce or minimize residual ISI of the system by generating an adaptation control signal to control the CTLE. A multi-tap ISI assessment circuit 470 may be used to reduce or minimize residual ISI. The multi-tap ISI assessment circuit 470 may generate and provide a weighted ISI sum to an ISI minimization circuit 475. The ISI minimization circuit 475 may be used to generate a continuous time linear equalizer (CTLE) adaptation control signal based on the weighted ISI sum. A residual noise assessment circuit 480 may also be used generate a noise level assessment signal based on the weighted ISI sum analysis, and the ISI minimization circuit 475 may generate the CTLE adaptation control signal based on the noise level assessment signal. The CTLE circuit 425 may generate a reduced ISI signal based on the CTLE adaptation control signal.

In a first example, the multi-tap ISI assessment circuit 470 may receive an ADC digital signal from the ADC circuit 435, assess the ISI within the ADC digital signal 440, and generate the weighted ISI sum based on the assessment of the ISI within the ADC digital signal 440. In a second example, the multi-tap ISI assessment circuit 470 may receive the sliced data stream, the sliced cursor error stream, and the equalizer coefficient commands 455, and may generate the weighted ISI sum based on the received data and error. In this second example, the ISI at the output of the digital equalizer circuit 445 is assessed by examining the equalizer coefficient commands, and residual ISI is detected at equalizer taps not covered by the digital equalizer circuit 445 using the sliced data stream and the cursor error stream. In each example, the multi-tap ISI assessment circuit 470 calculates the weighted sum of specific ISI components (e.g., taps) and the ISI minimization circuit 475 provides a CTLE adaptation control signal to minimize the residual ISI. Additional details about the generation of the CTLE adaptation control signal are described below with respect to modified LMS engine shown in FIG. 5.

Figure 5:
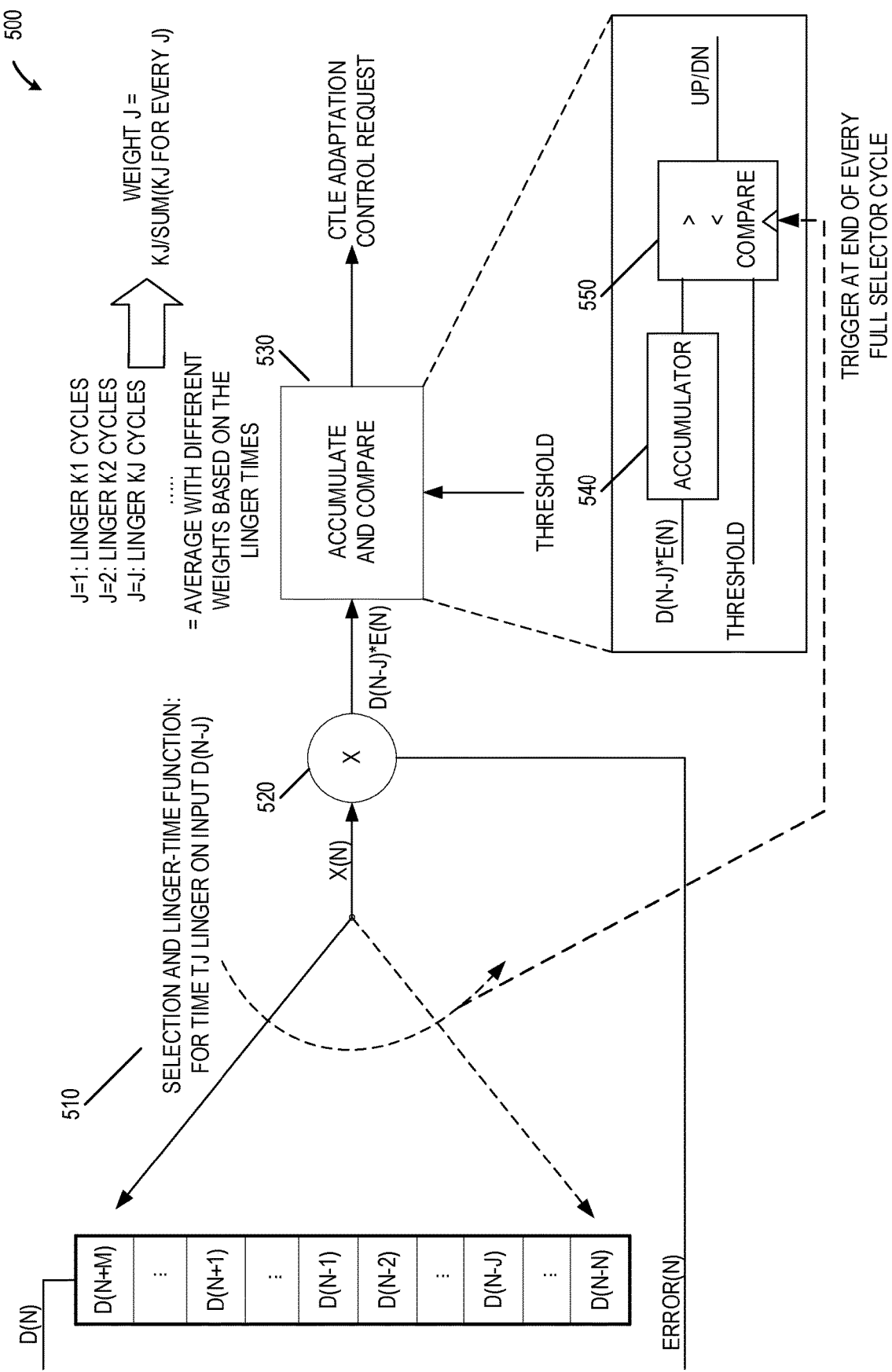
FIG. 5 shows a modified LMS engine circuit for multi tap ISI assessment, according to some embodiments described herein.

FIG. 5 shows a modified LMS engine circuit 500 for multi tap ISI assessment, according to some embodiments described herein. LMS engine circuit 500 generates a weighted average ISI signal X(N) based on the sliced data stream D(N). The selector circuit 510 generates the weighted average ISI signal X(N) by selecting and lingering on data elements within the sliced data stream, where each of the data elements has an associated linger time.

LMS engine circuit 500 includes a multiplier circuit 520 to generate a correlated ISI signal based on a correlation between the weighted average ISI signal X(N) and the sliced cursor error stream E(N). In particular, the multiplier circuit 520 generates the correlated ISI signal based on a correlation between each of the data elements within the sliced data stream D(N) and each of the error elements within the cursor error stream E(N). For a given selection of ISI component j, the LMS engine circuit 500 this correlation is calculated as the orthogonal projection of D(N-J) on the cursor error E(N), which corresponds to the $j^{th}$ ISI component.

LMS engine circuit 500 includes an accumulate and compare circuit 530 to generate the CTLE adaptation control signal based on the correlated ISI signal generated by the multiplier circuit 520. The accumulate and compare circuit 530 includes an accumulator circuit 540, which generates a weighted average of correlated ISI elements within the correlated ISI signal based on an associated linger time. The accumulate and compare circuit 530 also includes a comparator circuit 550 to receive an accumulator threshold value and a periodic trigger input, where the periodic trigger input indicates an end of a full selector cycle. When triggered, the comparator circuit 550 compares the accumulator threshold value against the weighted average of the correlated ISI elements provided by the accumulator circuit 540. When the weighted average of the correlated ISI elements crosses the accumulator threshold, the comparator circuit 550 generates the CTLE adaptation control signal. The CTLE adaptation control signal may include a CTLE up control signal to command CLTE circuit 425 to increase CTLE equalization to reduce the weighted ISI sum, a CTLE down control signal to reduce CTLE equalization in order to reduce the weighted ISI sum, or a CTLE hold control signal to make no change to the CTLE equalization or weighted ISI sum.s The LMS engine circuit 500 use of a selector circuit 510, a multiplier circuit 520, and an accumulate and compare circuit 530 provides an efficient implementation. Compared with solutions that use digital multiplexers, the LMS engine circuit 500 provides a smaller and more power efficient circuit. The LMS engine circuit 500 is also very flexible, as it leverages time-domain averaging to implement weighting of any set of ISI components with improved ISI resolution. The LMS engine circuit 500 provides the ability to select weights the ISI components of different taps. In an example, the $1^{st}$ post cursor may be assigned weight $\alpha_1$ and the $3^{rd}$ post cursor assigned weight $\alpha_3$. Using the selector circuit 510, index j=1 is selected for $K_1$ time cycles and j=3 for $K_3$ time cycles repeatedly, so $\alpha_1=K_1/(K_1+K_3)$ and $\alpha_3=K_3/(K_1+K_3)$. Because the accumulate and compare circuit 530 will average these cycles for a long time, the response of the LMS engine circuit 500 will correspond to the sum of the individual ISI components with the weights selected.

The LMS engine circuit 500 may be configured to use specific tap weights. In an example, $K_j$ denotes the number of cycles of dwell on the $j^{th}$ ISI component, while $\alpha_j$ denotes the resulting weight of the ISI component in the weighted sum. Generalizing for M precursors, the cursor, and N postcursors, the average weighing of this loop controls the CTLE peaking based on the weighted average ISI components: $X(n)=D(n-j)\forall j\in(-M, N)$ where $Ks_j=\sum_{i=-M}^{j}K_i$ and $K=Ks_N$. This generalization for M pre-cursors and N post-cursors includes the cursor, but this cursor may be excluded by assigning it a weight of 0 (e.g., $K_0=0$). The values of j(n) may then be defined as follows:

$$\begin{cases} -M & \text{for } 0 \le (n \bmod K) < Ks_{-M} \\ -M+1 & \text{for } Ks_{-M} \le (n \bmod K) < Ks_{-M+1} \\ -M+2 & \text{for } Ks_{-M+1} \le (n \bmod K) < Ks_{-M+2} \\ \cdots \\ N-1 & \text{for } Ks_{N-2} \le (n \bmod K) < Ks_{N-1} \\ N & \text{for } Ks_{N-1} \le (n \bmod K) < Ks_N \end{cases}$$

Thus, the selector circuit 510 will pass D(n+M) to X(n) for $K_{-M}$ cycles, then it will pass D(n+M−1) to X(n) for $K_{-M+1}$ cycles, and so on, finally passing D(n−N) to X(n) for $K_N$ cycles, after which it will return to D(n+M) and repeat. The weight of tap j will thus be:

$$\alpha_j = \frac{K_j}{\sum_{i=-M}^{N} K_i} = K_j/Ks_N.$$

To exclude a certain tap j in the weighting, $K_j$ is chosen to be zero, so that D(n−j) is never passed to the input of the LMS engine circuit 500, X(n). In this case, the selector circuit 510 will skip this tap and not linger on it during the cycle.

After every full selector cycle, a periodic trigger input indicating an end of a full selector cycle is provided to the comparator circuit 550. When triggered, the comparator circuit 550 compares the accumulator threshold value against the weighted average of the correlated ISI elements provided by the accumulator circuit 540. The accumulator threshold value may be selected based on a desired correlation level between the error and weighted sum of ISI components for CTLE convergence. This accumulator threshold value and therefore the correlation level may be selected to increase or decrease post-CTLE ISI, and the CTLE will adapt to supply enough peaking to sustain the desired change.

The correlation level between the error and weighted sum of ISI components may also be used to detect when this modified LMS engine circuit 500 is being used in a SERDES. The LMS engine circuit 500 may be detected by changing equalizer coefficient commands and observing the CTLE adaptation control signal or by monitoring the ISI on each channel. Changed equalizer coefficient values will result in changing levels of residual ISI and will affect the correlation level, which can be used to cause a change in the CTLE adaptation control signal. If a system does not include a digital equalizer, changes to the ISI profile may be implemented through the channel input or through a transmission equalizer.

Figure 6:
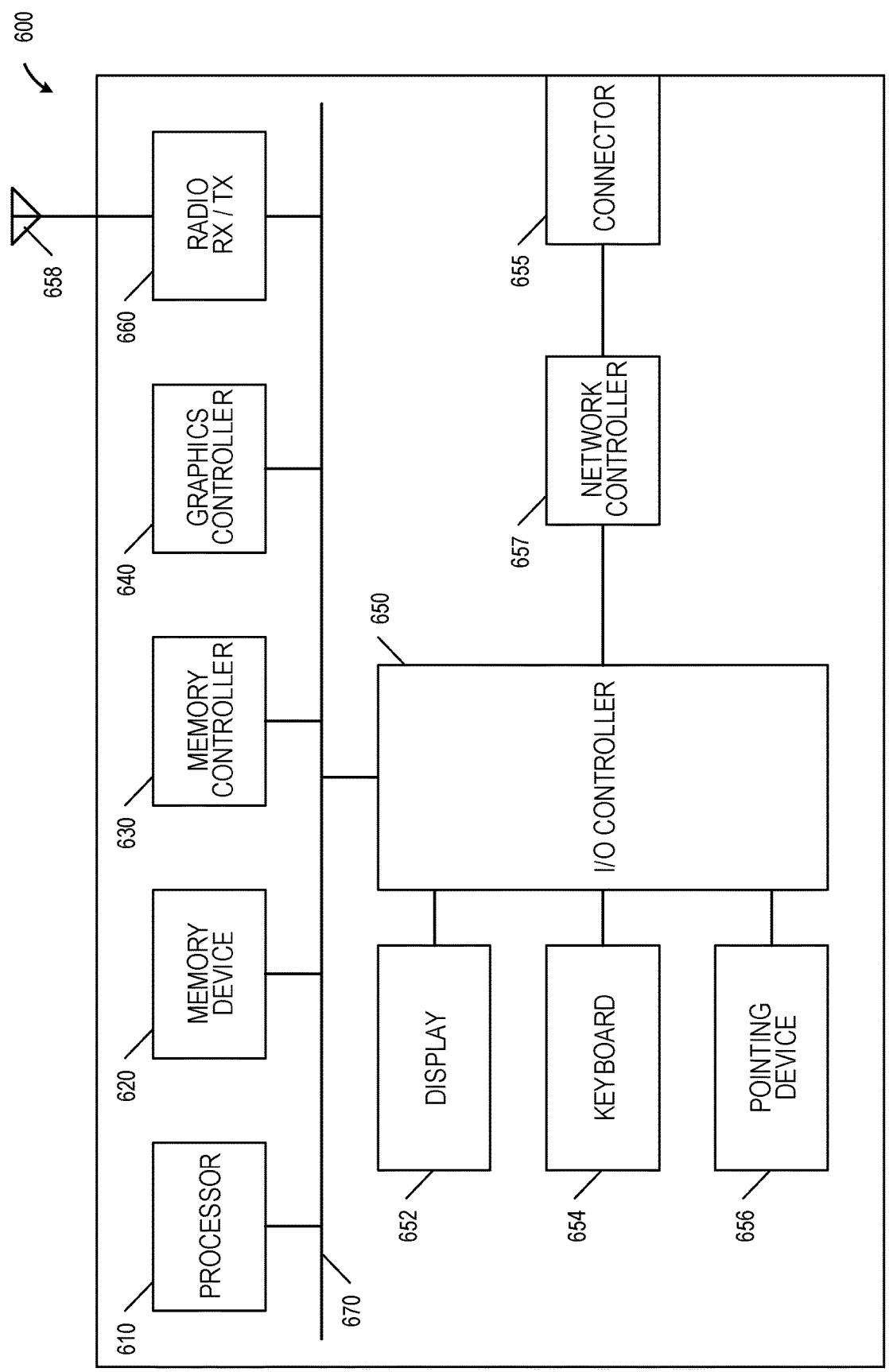
FIG. 6 shows an apparatus in the form of a system, according to some embodiments described herein.

FIG. 6 shows an apparatus in the form of a system (e.g., electronic system) 600, according to some embodiments described herein. System 600 may include or be included in a computer, a tablet, or other electronic system. As shown in FIG. 6, system 600 may include components located on a circuit board (e.g., printed circuit board (PCB)) 602, such as a processor 610, a memory device 620, a memory controller 630, a graphics controller 640, an I/O controller 650, a display 652, a keyboard 654, a pointing device 656, zero or more antennas 658, a radio receiver/transmitter (RX/TX) block 660, a connector 655, and a bus 670. Display 652 may include a liquid crystal display (LCD), a touchscreen (e.g., capacitive or resistive touchscreen), or another type of display. Pointing device 656 may include a mouse, a stylus, or another type of pointing device. Bus 670 may include conductive lines (e.g., metal-based traces on a circuit board where the components of system 600 are located).

Processor 610 may include a general-purpose processor, an application specific integrated circuit (ASIC), or other kinds of processors. Processor 610 may include a CPU. Memory device 620 may include a dynamic random access memory (DRAM) device, a static random access memory (SRAM) device, a flash memory device, phase change memory, a combination of these memory devices, or other types of memory. FIG. 6 shows an example where memory device 620 is a stand-alone memory device separated from processor 610. In an alternative arrangement, memory device 620 and processor 610 may be located on the same die. In such an alternative arrangement, memory device 620 is an embedded memory in processor 610, such as embedded DRAM (eDRAM), embedded SRAM (eSRAM), embedded flash memory, or another type of embedded memory.

I/O controller 650 may include a communication module for wired or wireless communication (e.g., communication through zero or more antennas 658). Such wireless communication may include communication in accordance with WiFi communication technique, Long Term Evolution Advanced (LTE-A) communication technique, or other communication techniques. I/O controller 650 may also include a module to allow system 600 to communicate with other devices or systems in accordance with to one or more of the following standards or specifications (e.g., I/O standards or specifications), including Universal Serial Bus (USB), DisplayPort (DP), High-Definition Multimedia Interface (HDMI), Thunderbolt, Peripheral Component Interconnect Express (PCIe), Ethernet, and other specifications.

Connector 655 may be arranged (e.g., may include terminals, such as pins) to allow system 600 to be coupled through a network controller 657 to an external device (or system). This may allow system 600 to communicate (e.g., exchange information) with such a device (or system) through network controller 657 and through connector 655. Connector 655 and at least a portion of bus 670 may include conductive lines that conform with at least one of USB, DP, HDMI, Thunderbolt, PCIe, Ethernet, and other specifications.

As shown in FIG. 6, each of processor 610, memory device 620, memory controller 630, graphics controller 640, and I/O controller 650 may include the CLTE SERDES circuits described above with reference to FIG. 1 through FIG. 5. FIG. 6 shows each of processor 610, memory device 620, memory controller 630, graphics controller 640, and I/O controller 650 including a CLTE SERDES circuit, as an example. However, fewer than all of processor 610, memory device 620, memory controller 630, graphics controller 640, and I/O controller 650 may include the CLTE SERDES circuit.

FIG. 6 shows the components of system 600 arranged separately from each other as an example. For example, each of processor 610, memory device 620, memory controller 630, graphics controller 640, and I/O controller 650 may be located on a separate IC (e.g., semiconductor die or an IC chip). In some arrangements, two or more components (e.g., processor 610, memory device 620, graphics controller 640, and I/O controller 650) of system 600 may be located on the same die (e.g., same IC chip) that may be part of a system on chip, a system in a package, or other electronic devices or systems.

The illustrations of the CLTE SERDES circuit described above are intended to provide a general understanding of the structure of different embodiments, and are not intended to provide a complete description of all the elements and features of an apparatus that might make use of the structures described herein. In some arrangements, system 600 does not have to include a display. Thus, display 652 may be omitted from system 600. In some arrangements, system 600 does not have to include any antenna. Thus, antenna 658 may be omitted from system 600. In some arrangements, system 600 does not have to include a connector. Thus, connector 655 or network controller 657 may be omitted from system 600.

The apparatuses and methods described above may include or be included in high-speed computers, communication and signal processing circuitry, single-processor module or multi-processor modules, single embedded processors or multiple embedded processors, multi-core processors, message information switches, and application-specific modules including multilayer or multi-chip modules. Such apparatuses may further be included as sub-components within a variety of other apparatuses (e.g., electronic systems), such as televisions, cellular telephones, personal computers (e.g., laptop computers, desktop computers, handheld computers, etc.), tablets (e.g., tablet computers), workstations, radios, video players, audio players (e.g., MP3 (Motion Picture Experts Group, Audio Layer 3) players), vehicles, medical devices (e.g., heart monitors, blood pressure monitors, etc.), set top boxes, and others.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, a list of items joined by the term "at least one of" may mean any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A, B, and C. Item A may include a single element or multiple elements. Item B may include a single element or multiple elements. Item C may include a single element or multiple elements.

In the detailed description and the claims, a list of items joined by the term "one of" may mean only one of the list items. For example, if items A and B are listed, then the phrase "one of A and B" means A only (excluding B), or B only (excluding A). In another example, if items A, B, and C are listed, then the phrase "one of A, B and C" means A only; B only; or C only. Item A may include a single element or multiple elements. Item B may include a single element or multiple elements. Item C may include a single element or multiple elements.

Additional Notes and Examples

Example 1 is an apparatus comprising: an analog receiver frontend to generate an analog-to-digital converter (ADC) digital signal based on a received analog input signal; a data path circuit to generate a sliced data stream and cursor error stream based on the ADC digital signal; a digital signal processing (DSP) circuit to generate a converged data stream based on the sliced data stream and the cursor error stream; a multi-tap intersymbol interference (ISI) assessment circuit to generate a weighted ISI sum; and an ISI minimization circuit to generate a continuous time linear equalizer (CTLE) adaptation control signal based on the weighted ISI sum; wherein the analog receiver frontend is further to generate a reduced ISI signal based on the CTLE adaptation control signal.

In Example 2, the subject matter of Example 1 includes, wherein the multi-tap ISI assessment circuit includes: a selector circuit to generate a weighted average ISI signal based on the sliced data stream; a multiplier circuit to generate a correlated ISI signal based on a correlation between the weighted average ISI signal and the cursor error stream; and an accumulator circuit to generate the CTLE adaptation control signal based on the correlated ISI signal.

In Example 3, the subject matter of Example 2 includes, wherein: the selector circuit generates the weighted average ISI signal by selecting and lingering on each of a plurality of data elements within the sliced data stream, each of the plurality of data elements having an associated linger time; the multiplier circuit generates the correlated ISI signal based on a correlation between each of a plurality of data elements within the sliced data stream and each of a plurality of error elements within the cursor error stream; and the accumulator circuit generates the CTLE adaptation control signal based on a weighted average of a plurality of correlated ISI elements within the correlated ISI signal, wherein the weighted average of the plurality of correlated ISI elements is generated based on the associated linger time.

In Example 4, the subject matter of Example 3 includes, wherein: the accumulator circuit includes a comparator circuit to receive an accumulator threshold value and a periodic trigger input, the periodic trigger input indicating an end of a full selector cycle; the comparator circuit generates the CTLE adaptation control signal in response to receiving the periodic trigger input; and the comparator circuit generates the CTLE adaptation control signal based on a comparison between the accumulator threshold value and the weighted average of the plurality of correlated ISI elements within the correlated ISI signal.

In Example 5, the subject matter of Examples 1-4 includes, wherein the multi-tap ISI assessment circuit is to generate the weighted ISI sum based on the ADC digital signal received from the analog receiver frontend.

In Example 6, the subject matter of Example 5 includes, wherein: the DSP circuit is further to generate a plurality of equalizer coefficient commands based on the sliced data stream and the cursor error stream; and the multi-tap ISI assessment circuit is to generate the weighted ISI sum based on the plurality of equalizer coefficient commands, the sliced data stream, and the cursor error stream.

In Example 7, the subject matter of Example 6 includes, wherein the DSP circuit includes: a modified least means squared (LMS) circuit to generate an equalizer coefficient data stream based on the sliced data stream and the cursor error stream; and a coefficient accumulator circuit to generate the plurality of equalizer coefficient commands based on the equalizer coefficient data stream.

In Example 8, the subject matter of Example 7 includes, wherein the analog receiver frontend includes: a continuous time linear equalizer (CTLE) circuit to generate a CTLE signal based on the received analog input signal and the CTLE adaptation control signal; a variable gain amplifier (VGA) circuit to generate a VGA signal based on the CTLE signal and a plurality of automatic gain control (AGC) LMS coefficients generated by the DSP circuit; and an ADC circuit to generate the ADC digital signal based on the VGA signal.

In Example 9, the subject matter of Example 8 includes, wherein: the modified LMS circuit is further to generate a plurality of VGA coefficient commands based on the sliced data stream and the cursor error stream; and the coefficient accumulator circuit is further to generate the plurality of AGC LMS coefficients based on the plurality of VGA coefficient commands.

In Example 10, the subject matter of Examples 8-9 includes, wherein the CTLE circuit includes at least one of a source degeneration CTLE and a q-shaping CTLE.

In Example 11, the subject matter of Examples 6-10 includes, wherein the data path circuit includes: a digitally controlled equalizer to generate a digitally equalized signal based on the ADC digital signal and the plurality of equalizer coefficient commands; and a slicer to generate the sliced data stream based on the digitally equalized signal.

In Example 12, the subject matter of Example 11 includes, wherein the digitally controlled equalizer includes at least one of a feed-forward equalizer (FFE) and a decision feedback equalizer (DFE).

In Example 13, the subject matter of Examples 1-12 includes, a residual noise assessment circuit to generate a noise level assessment signal based on the weighted ISI sum; wherein the ISI minimization circuit is further to generate the CTLE adaptation control signal based on the noise level assessment signal.

In Example 14, the subject matter of Examples 1-13 includes, wherein the cursor error stream includes a sliced error stream.

Example 15 is a method comprising: generating an analog-to-digital converter (ADC) digital signal at an analog receiver frontend based on a received analog input signal; generating a sliced data stream and cursor error stream at a data path circuit based on the ADC digital signal; generating a converged data stream at a digital signal processing (DSP) circuit based on the sliced data stream and the cursor error stream; generating a weighted ISI sum at a multi-tap intersymbol interference (ISI) assessment circuit; generating a continuous time linear equalizer (CTLE) adaptation control signal at an ISI minimization circuit based on the weighted ISI sum; and generating a reduced ISI signal at the analog receiver frontend based on the CTLE adaptation control signal.

In Example 16, the subject matter of Example 15 includes, generating a weighted average ISI signal at a selector circuit within the multi-tap ISI assessment circuit, the weighted average ISI signal generated based on the sliced data stream; generating a correlated ISI signal at a multiplier circuit within the multi-tap ISI assessment circuit, the correlated ISI signal generated based on a correlation between the weighted average ISI signal and the cursor error stream; and generating the CTLE adaptation control signal at an accumulator circuit within the multi-tap ISI assessment circuit, the CTLE adaptation control signal generated based on the correlated ISI signal.

In Example 17, the subject matter of Example 16 includes, wherein: the generation of the weighted average ISI signal includes selecting and lingering on each of a plurality of data elements within the sliced data stream, each of the plurality of data elements having an associated linger time; the generation of the correlated ISI signal is based on a correlation between each of a plurality of data elements within the sliced data stream and each of a plurality of error elements within the cursor error stream; and the generation of the CTLE adaptation control signal is based on a weighted average of a plurality of correlated ISI elements within the correlated ISI signal, wherein the weighted average of the plurality of correlated ISI elements is generated based on the associated linger time.

In Example 18, the subject matter of Example 17 includes, receiving an accumulator threshold value and a periodic trigger input at a comparator circuit within the accumulator circuit, the periodic trigger input indicating an end of a full selector cycle; wherein the CTLE adaptation control signal is generated at the comparator circuit in response to receiving the periodic trigger input; and wherein the CTLE adaptation control signal is generated at the comparator circuit based on a comparison between the accumulator threshold value and the weighted average of the plurality of correlated ISI elements within the correlated ISI signal.

In Example 19, the subject matter of Examples 15-18 includes, generating the weighted ISI sum at the multi-tap ISI assessment circuit based on the ADC digital signal received from the analog receiver frontend.

In Example 20, the subject matter of Example 19 includes, generating a plurality of equalizer coefficient commands at the DSP circuit based on the sliced data stream and the cursor error stream; wherein the generation of the weighted ISI sum is based on the plurality of equalizer coefficient commands, the sliced data stream, and the cursor error stream.

In Example 21, the subject matter of Example 20 includes, generating an equalizer coefficient data stream at a modified least means squared (LMS) circuit within the DSP circuit, the equalizer coefficient data stream generated based on the sliced data stream and the cursor error stream; wherein the plurality of equalizer coefficient commands is generated based on the equalizer coefficient data stream.

In Example 22, the subject matter of Example 21 includes, generating a CTLE signal at a continuous time linear equalizer (CTLE) circuit within the analog receiver frontend, the CTLE signal generated based on the received analog input signal and the CTLE adaptation control signal; generating a VGA signal at a variable gain amplifier (VGA) circuit within the analog receiver frontend, the VGA signal generated based on the CTLE signal and a plurality of automatic gain control (AGC) LMS coefficients generated by the DSP circuit; and generating the ADC digital signal at an ADC circuit within the analog receiver frontend, the ADC digital signal generated based on the VGA signal.

In Example 23, the subject matter of Example 22 includes, generating a plurality of VGA coefficient commands at the modified LMS circuit based on the sliced data stream and the cursor error stream; and generating the plurality of AGC LMS coefficients at a coefficient accumulator circuit based on the plurality of VGA coefficient commands.

In Example 24, the subject matter of Examples 22-23 includes, wherein the CTLE circuit includes at least one of a source degeneration CTLE and a q-shaping CTLE.

In Example 25, the subject matter of Examples 20-24 includes, generating a digitally equalized signal at a digitally controlled equalizer within the data path circuit, the digitally equalized signal generated based on the ADC digital signal and the plurality of equalizer coefficient commands; and generating the sliced data stream at a slicer within the data path circuit, the sliced data stream generated based on the digitally equalized signal.

In Example 26, the subject matter of Example 25 includes, wherein the digitally controlled equalizer includes at least one of a feed-forward equalizer (FFE) and a decision feedback equalizer (DFE).

In Example 27, the subject matter of Examples 15-26 includes, generating a noise level assessment signal at a residual noise assessment circuit based on the weighted ISI sum; wherein the generation of the CTLE adaptation control signal at the ISI minimization circuit is based on the noise level assessment signal.

In Example 28, the subject matter of Examples 15-27 includes, wherein the cursor error stream includes a sliced error stream.

Example 29 is an apparatus comprising: a serializer/deserializer (SERDES) receiver to generate a reduced ISI signal based on an analog input signal received from a SERDES transmitter circuit, the SERDES receiver including: an analog receiver frontend to generate an analog-to-digital converter (ADC) digital signal based on a received analog input signal; a data path circuit to generate a sliced data stream and cursor error stream based on the ADC digital signal; a digital signal processing (DSP) circuit to generate a converged data stream based on the sliced data stream and the cursor error stream; a multi-tap intersymbol interference (ISI) assessment circuit to generate a weighted ISI sum; and an ISI minimization circuit to generate a continuous time linear equalizer (CTLE) adaptation control signal based on the weighted ISI sum; wherein the analog receiver frontend is further to generate the reduced ISI signal based on the CTLE adaptation control signal.

In Example 30, the subject matter of Example 29 includes, wherein the multi-tap ISI assessment circuit includes: a selector circuit to generate a weighted average ISI signal based on the sliced data stream; a multiplier circuit to generate a correlated ISI signal based on a correlation between the weighted average ISI signal and the cursor error stream; and an accumulator circuit to generate the CTLE adaptation control signal based on the correlated ISI signal.

In Example 31, the subject matter of Example 30 includes, wherein: the selector circuit generates the weighted average ISI signal by selecting and lingering on each of a plurality of data elements within the sliced data stream, each of the plurality of data elements having an associated linger time; the multiplier circuit generates the correlated ISI signal based on a correlation between each of a plurality of data elements within the sliced data stream and each of a plurality of error elements within the cursor error stream; and the accumulator circuit generates the CTLE adaptation control signal based on a weighted average of a plurality of correlated ISI elements within the correlated ISI signal, wherein the weighted average of the plurality of correlated ISI elements is generated based on the associated linger time.

In Example 32, the subject matter of Example 31 includes, wherein: the accumulator circuit includes a comparator circuit to receive an accumulator threshold value and a periodic trigger input, the periodic trigger input indicating an end of a full selector cycle; the comparator circuit generates the CTLE adaptation control signal in response to receiving the periodic trigger input; and the comparator circuit generates the CTLE adaptation control signal based on a comparison between the accumulator threshold value and the weighted average of the plurality of correlated ISI elements within the correlated ISI signal.

In Example 33, the subject matter of Examples 29-32 includes, wherein the multi-tap ISI assessment circuit is to generate the weighted ISI sum based on the ADC digital signal received from the analog receiver frontend.

In Example 34, the subject matter of Example 33 includes, wherein: the DSP circuit is further to generate a plurality of equalizer coefficient commands based on the sliced data stream and the cursor error stream; and the multi-tap ISI assessment circuit is to generate the weighted ISI sum based on the plurality of equalizer coefficient commands, the sliced data stream, and the cursor error stream.

In Example 35, the subject matter of Example 34 includes, wherein the DSP circuit includes: a modified least means squared (LMS) circuit to generate an equalizer coefficient data stream based on the sliced data stream and the cursor error stream; and a coefficient accumulator circuit to generate the plurality of equalizer coefficient commands based on the equalizer coefficient data stream.

In Example 36, the subject matter of Example 35 includes, wherein the analog receiver frontend includes: a continuous time linear equalizer (CTLE) circuit to generate a CTLE signal based on the received analog input signal and the CTLE adaptation control signal; a variable gain amplifier (VGA) circuit to generate a VGA signal based on the CTLE signal and a plurality of automatic gain control (AGC) LMS coefficients generated by the DSP circuit; and an ADC circuit to generate the ADC digital signal based on the VGA signal.

In Example 37, the subject matter of Example 36 includes, wherein: the modified LMS circuit is further to generate a plurality of VGA coefficient commands based on the sliced data stream and the cursor error stream; and the coefficient accumulator circuit is further to generate the plurality of AGC LMS coefficients based on the plurality of VGA coefficient commands.

In Example 38, the subject matter of Examples 36-37 includes, wherein the CTLE circuit includes at least one of a source degeneration CTLE and a q-shaping CTLE.

In Example 39, the subject matter of Examples 34-38 includes, wherein the data path circuit includes: a digitally controlled equalizer to generate a digitally equalized signal based on the ADC digital signal and the plurality of equalizer coefficient commands; and a slicer to generate the sliced data stream based on the digitally equalized signal.

In Example 40, the subject matter of Example 39 includes, wherein the digitally controlled equalizer includes at least one of a feed-forward equalizer (FFE) and a decision feedback equalizer (DFE).

In Example 41, the subject matter of Examples 29-40 includes, a residual noise assessment circuit to generate a noise level assessment signal based on the weighted ISI sum; wherein the ISI minimization circuit is further to generate the CTLE adaptation control signal based on the noise level assessment signal.

In Example 42, the subject matter of Examples 29-41 includes, wherein the cursor error stream includes a sliced error stream.

Example 43 is at least one machine-readable medium including instructions that, when executed by processing circuitry, cause the processing circuitry to perform operations to implement of any of Examples 1-42.

Example 44 is an apparatus comprising means to implement of any of Examples 1-42.

Example 45 is a system to implement of any of Examples 1-42.

Example 46 is a method to implement of any of Examples 1-42.

The subject matter of Example 1 through Example 46 may be combined in any combination.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
an analog receiver frontend to generate an analog-to-digital converter (ADC) digital signal based on a received analog input signal;
a data path circuit to generate a sliced data stream and cursor error stream based on the ADC digital signal;
a digital signal processing (DSP) circuit to generate a converged data stream based on the sliced data stream and the cursor error stream;
a multi-tap intersymbol interference (ISI) assessment circuit to generate a weighted ISI sum based on the sliced data stream;
a multiplier circuit to generate a correlated ISI signal based on a correlation between the weighted ISI signal and the cursor error stream; and
an ISI minimization circuit to generate a continuous time linear equalizer (CTLE) adaptation control signal based on the correlated ISI signal;
wherein the analog receiver frontend is further to generate a reduced ISI signal based on the CTLE adaptation control signal.

2. The apparatus of claim 1, wherein:
the multi-tap ISI assessment circuit generates the weighted ISI signal by selecting and lingering on each of a plurality of data elements within the sliced data stream, each of the plurality of data elements having an associated linger time;
the multiplier circuit generates the correlated ISI signal based on a correlation between each of a plurality of data elements within the sliced data stream and each of a plurality of error elements within the cursor error stream; and
the ISI minimization circuit generates the CTLE adaptation control signal based on a weighted average of a plurality of correlated ISI elements within the correlated ISI signal, wherein the weighted average of the plurality of correlated ISI elements is generated based on the associated linger time.

3. The apparatus of claim 2, wherein:
the ISI minimization circuit includes a comparator circuit to receive an accumulator threshold value and a periodic trigger input, the periodic trigger input indicating an end of a full selector cycle;
the comparator circuit generates the CTLE adaptation control signal in response to receiving the periodic trigger input; and
the comparator circuit generates the CTLE adaptation control signal based on a comparison between the accumulator threshold value and the weighted average of the plurality of correlated ISI elements within the correlated ISI signal.

4. The apparatus of claim 1, wherein the multi-tap ISI assessment circuit is to generate the weighted ISI sum based on the ADC digital signal received from the analog receiver frontend.

5. The apparatus of claim 4, wherein:
the DSP circuit is further to generate a plurality of equalizer coefficient commands based on the sliced data stream and the cursor error stream; and
the multi-tap ISI assessment circuit is to generate the weighted ISI sum based on the plurality of equalizer coefficient commands, the sliced data stream, and the cursor error stream.

6. The apparatus of claim 5, wherein the DSP circuit includes:
a modified least means squared (LMS) circuit to generate an equalizer coefficient data stream based on the sliced data stream and the cursor error stream; and
a coefficient accumulator circuit to generate the plurality of equalizer coefficient commands based on the equalizer coefficient data stream.

7. The apparatus of claim 6, wherein the analog receiver frontend includes:
a continuous time linear equalizer (CTLE) circuit to generate a CTLE signal based on the received analog input signal and the CTLE adaptation control signal;
a variable gain amplifier (VGA) circuit to generate a VGA signal based on the CTLE signal and a plurality of automatic gain control (AGC) LMS coefficients generated by the DSP circuit; and
an ADC circuit to generate the ADC digital signal based on the VGA signal.

8. The apparatus of claim 7, wherein:
the modified LMS circuit is further to generate a plurality of VGA coefficient commands based on the sliced data stream and the cursor error stream; and
the coefficient accumulator circuit is further to generate the plurality of AGC LMS coefficients based on the plurality of VGA coefficient commands.

9. The apparatus of claim 1, further including a residual noise assessment circuit to generate a noise level assessment signal based on the weighted ISI sum;
wherein the ISI minimization circuit is further to generate the CTLE adaptation control signal based on the noise level assessment signal.

10. A method comprising:
generating an analog-to-digital converter (ADC) digital signal at an analog receiver frontend based on a received analog input signal;
generating a sliced data stream and cursor error stream at a data path circuit based on the ADC digital signal;
generating a converged data stream at a digital signal processing (DSP) circuit based on the sliced data stream and the cursor error stream;
generating a weighted ISI sum at a multi-tap intersymbol interference (ISI) assessment circuit based on the sliced data stream;
generating a correlated ISI signal a multiplier circuit based on a correlation between the weighted ISI signal and the cursor error stream;
generating a continuous time linear equalizer (CTLE) adaptation control signal at an ISI minimization circuit based on the correlated ISI; and
generating a reduced ISI signal at the analog receiver frontend based on the CTLE adaptation control signal.

11. The method of claim 10, wherein:
the generation of the weighted ISI signal includes selecting and lingering on each of a plurality of data elements within the sliced data stream, each of the plurality of data elements having an associated linger time;
the generation of the correlated ISI signal is based on a correlation between each of a plurality of data elements within the sliced data stream and each of a plurality of error elements within the cursor error stream; and
the generation of the CTLE adaptation control signal is based on a weighted average of a plurality of correlated ISI elements within the correlated ISI signal, wherein the weighted average of the plurality of correlated ISI elements is generated based on the associated linger time.

12. The method of claim 11, further including receiving an accumulator threshold value and a periodic trigger input at a comparator circuit within the ISI minimization circuit, the periodic trigger input indicating an end of a full selector cycle;
wherein the CTLE adaptation control signal is generated at the comparator circuit in response to receiving the periodic trigger input; and
wherein the CTLE adaptation control signal is generated at the comparator circuit based on a comparison between the accumulator threshold value and the weighted average of the plurality of correlated ISI elements within the correlated ISI signal.

13. The method of claim 10, further including generating the weighted ISI sum at the multi-tap ISI assessment circuit based on the ADC digital signal received from the analog receiver frontend.

14. The method of claim 13, further including generating a plurality of equalizer coefficient commands at the DSP circuit based on the sliced data stream and the cursor error stream;
wherein the generation of the weighted ISI sum is based on the plurality of equalizer coefficient commands, the sliced data stream, and the cursor error stream.

15. The method of claim 14, further including generating an equalizer coefficient data stream at a modified least means squared (LMS) circuit within the DSP circuit, the equalizer coefficient data stream generated based on the sliced data stream and the cursor error stream;
wherein the plurality of equalizer coefficient commands is generated based on the equalizer coefficient data stream.

16. The method of claim 15, further including:
generating a CTLE signal at a continuous time linear equalizer (CTLE) circuit within the analog receiver frontend, the CTLE signal generated based on the received analog input signal and the CTLE adaptation control signal;
generating a VGA signal at a variable gain amplifier (VGA) circuit within the analog receiver frontend, the VGA signal generated based on the CTLE signal and a plurality of automatic gain control (AGC) LMS coefficients generated by the DSP circuit; and
generating the ADC digital signal at an ADC circuit within the analog receiver frontend, the ADC digital signal generated based on the VGA signal.

17. An apparatus comprising:
a serializer/deserializer (SERDES) receiver to generate a reduced ISI signal based on an analog input signal received from a SERDES transmitter circuit, the SERDES receiver including:
an analog receiver frontend to generate an analog-to-digital converter (ADC) digital signal based on a received analog input signal;
a data path circuit to generate a sliced data stream and cursor error stream based on the ADC digital signal;
a digital signal processing (DSP) circuit to generate a converged data stream based on the sliced data stream and the cursor error stream;
a multi-tap intersymbol interference (ISI) assessment circuit to generate a weighted ISI sum based on the sliced data stream;
a multiplier circuit to generate a correlated ISI signal based on a correlation between the weighted ISI signal and the cursor error stream; and an ISI minimization circuit to generate a continuous time linear equalizer (CTLE) adaptation control signal based on the correlated ISI signal;

wherein the analog receiver frontend is further to generate the reduced ISI signal based on the CTLE adaptation control signal.

18. The apparatus of claim 17, wherein:

the multi-tap ISI assessment circuit generates the weighted average ISI signal by selecting and lingering on each of a plurality of data elements within the sliced data stream, each of the plurality of data elements having an associated linger time;

the multiplier circuit generates the correlated ISI signal based on a correlation between each of a plurality of data elements within the sliced data stream and each of a plurality of error elements within the cursor error stream; and the ISI minimization circuit generates the CTLE adaptation control signal based on a weighted average of a plurality of correlated ISI elements within the correlated ISI signal, wherein the weighted average of the plurality of correlated ISI elements is generated based on the associated linger time.

19. The apparatus of claim 18, wherein;

the ISI minimization circuit includes a comparator circuit to receive an accumulator threshold value and a periodic trigger input, the periodic trigger input indicating an end of a full selector cycle;

the comparator circuit generates the CTLE adaptation control signal in response to receiving the periodic trigger input; and the comparator circuit generates the CTLE adaptation control signal based on a comparison between the accumulator threshold value and the weighted average of the plurality of correlated ISI elements within the correlated ISI signal.

20. The apparatus of claim 17, wherein the multi-tap ISI assessment circuit is to generate the weighted ISI sum based on the ADC digital signal received from the analog receiver frontend.

21. The apparatus of claim 20, wherein:

the DSP circuit is further to generate a plurality of equalizer coefficient commands based on the sliced data stream and the cursor error stream; and the multi-tap ISI assessment circuit is to generate the weighted ISI sum based on the plurality of equalizer coefficient commands, the sliced data stream, and the cursor error stream.

22. The apparatus of claim 21, wherein the DSP circuit includes:

a modified least means squared (LMS) circuit to generate an equalizer coefficient data stream based on the sliced data stream and the cursor error stream; and a coefficient accumulator circuit to generate the plurality of equalizer coefficient commands based on the equalizer coefficient data stream.

* * * * *